(12) United States Patent
Verilhac et al.

(10) Patent No.: US 10,741,799 B2
(45) Date of Patent: Aug. 11, 2020

(54) METHOD FOR FORMING A STACK AND STACK

(71) Applicants: COMMISSARIAT A L'ENERGIE ATOMIQUE ET AUX ENERGIES ALTERNATIVES, Paris (FR); TRIXELL, Moirans (FR)

(72) Inventors: Jean-Marie Verilhac, Coublevie (FR); Mohammed Benwadih, Champigny sur Marne (FR); Simon Charlot, Grenoble (FR)

(73) Assignees: COMMISSARIAT A L'ENERGIE ET AUX ENERGIES ALTERNATIVES, Paris (FR); TRIXELL, Moirans (FR)

( * ) Notice: Subject to any disclaimer, the term of this patent is extended or adjusted under 35 U.S.C. 154(b) by 0 days.

(21) Appl. No.: 16/468,666

(22) PCT Filed: Nov. 30, 2017

(86) PCT No.: PCT/EP2017/080905
§ 371 (c)(1),
(2) Date: Jun. 11, 2019

(87) PCT Pub. No.: WO2018/108540
PCT Pub. Date: Jun. 21, 2018

(65) Prior Publication Data
US 2019/0334129 A1    Oct. 31, 2019

(30) Foreign Application Priority Data
Dec. 12, 2016 (FR) ..................... 16 62292

(51) Int. Cl.
*H01L 51/52* (2006.01)
*H01L 51/56* (2006.01)
*H01L 51/44* (2006.01)

(52) U.S. Cl.
CPC .............. *H01L 51/56* (2013.01); *H01L 51/44* (2013.01); *H01L 51/52* (2013.01); *H01L 2251/568* (2013.01)

(58) Field of Classification Search
CPC ......... H01L 2251/568; H01L 21/76877; H01L 21/76868; H01L 21/76883; H01L 27/14636; H01L 29/66545
See application file for complete search history.

(56) References Cited

U.S. PATENT DOCUMENTS 4,409,270 A * 10/1983 Faber ...................... B29C 73/02
                                                                156/94
4,519,851 A *  5/1985 Perry ....................... C23C 8/10
                                                                148/286
(Continued)

FOREIGN PATENT DOCUMENTS

FR          3 010 232 A1     3/2015
WO       2013/098951 A1     7/2013

*Primary Examiner* — Jaehwan Oh
(74) *Attorney, Agent, or Firm* — Baker & Hostetler LLP

(57) ABSTRACT

A method for producing a stack, includes the following steps: forming a first layer able to conduct electricity, forming a layer of interest on the first layer, the layer of interest comprising at least one free volume, forming at least one repairing element, each repairing element at least partially filling a free volume, called the free volume of interest, the repairing element comprising at least one insulating layer and leaving free an upper surface of the layer of interest opposite the first layer located outside of the at least one free volume, forming a second layer, able to conduct electricity, on the layer of interest, the second layer covering the repairing element and the free surface, the step of forming the repairing element comprising the following steps: forming, on the layer of interest, a layer that extends at least partially into the free volume of interest, covering at least one portion of the buffer layer located in the volume of (Continued)

interest with a filling layer, the buffer layer and the filling layer being made from different materials.

21 Claims, 4 Drawing Sheets

(56) References Cited

U.S. PATENT DOCUMENTS

| | | | |
|---|---|---|---|
| 6,642,146 B1* | 11/2003 | Rozbicki | H01L 21/76805 |
| | | | 438/622 |
| 6,764,940 B1* | 7/2004 | Rozbicki | H01L 21/76805 |
| | | | 438/627 |
| 8,524,592 B1* | 9/2013 | Xie | H01L 29/78 |
| | | | 257/387 |
| 9,768,272 B2* | 9/2017 | Hashemi | H01L 29/6656 |
| 10,032,913 B2* | 7/2018 | Chang | H01L 29/6656 |
| 10,170,336 B1* | 1/2019 | Li | H01J 37/32357 |
| 2005/0095846 A1* | 5/2005 | Basol | H01L 21/76868 |
| | | | 438/637 |
| 2006/0033678 A1* | 2/2006 | Lubomirsky | H01L 21/67745 |
| | | | 345/32 |
| 2006/0270143 A1* | 11/2006 | Goldbach | H01L 27/10888 |
| | | | 438/238 |
| 2008/0003355 A1* | 1/2008 | Piton | B05D 7/14 |
| | | | 427/140 |
| 2008/0233826 A1* | 9/2008 | Matsuda | H01L 51/56 |
| | | | 445/2 |
| 2010/0084766 A1* | 4/2010 | Yang | H01L 21/76849 |
| | | | 257/763 |
| 2012/0126277 A1* | 5/2012 | Tanaka | H01L 51/50 |
| | | | 257/99 |
| 2013/0105821 A1 | 5/2013 | You et al. | |
| 2013/0307151 A1* | 11/2013 | Bonilla | H01L 21/76832 |
| | | | 257/750 |
| 2014/0217383 A1* | 8/2014 | Park | H01L 51/5256 |
| | | | 257/40 |
| 2016/0254498 A1* | 9/2016 | Ma | H01L 51/56 |
| | | | 438/4 |
| 2017/0077460 A1* | 3/2017 | Hayashida | H01L 27/3246 |
| 2017/0178975 A1* | 6/2017 | Chang | H01L 29/7848 |
| 2017/0203524 A1* | 7/2017 | Huang | C08J 5/04 |
| 2017/0263670 A1* | 9/2017 | Kawahara | H01L 27/14645 |
| 2017/0313002 A1* | 11/2017 | Huang | B29C 35/0805 |

* cited by examiner

METHOD FOR FORMING A STACK AND STACK

CROSS-REFERENCE TO RELATED APPLICATIONS

This application is a National Stage of International patent application PCT/EP2017/080905, filed on Nov. 30, 2017, which claims priority to foreign French patent application No. FR 1662292, filed on Dec. 12, 2016, the disclosures of which are incorporated by reference in their entirety.

FIELD OF THE INVENTION

The invention relates to a process for repairing defects in thin-layer stacks intended to be used in electronic devices.

BACKGROUND

The devices in question may, for example, be transistors, for example field-effect transistors, current-rectifying diodes, solar cells, photodetector cells, capacitors, laser diodes, sensor-type devices, memories, or even light-emitting diodes, passive components (inductors, capacitors, resistors), pressure sensors or temperature sensors. It is in particular a question of organic electronic devices on rigid or supple (plastic) substrates. These devices may take the form of independent components or components that are connected together. The stack may be intended to form a single device or a plurality of devices, for example a matrix array of devices.

The invention more particularly applies to the field of the stacks of organic diodes and to the stacks used in organic solar cells or organic photodetectors.

These stacks conventionally comprise a thin, organic, partially organic or inorganic, and insulating, semiconductor or conductive, layer of interest interposed between two layers that are able to conduct electricity.

In the known devices of the prior art, a plurality of types of topological fabrication defects are observed to appear in the layers of interest. These defects are of the free-volume type. They may be through-holes in the layer of interest; they then emerge onto either side of the active layer. It may also be a question of zones of larger free volume between the active layer and a conductive layer than in the rest of the layer of interest. The latter zones are for example blind holes that open onto a single of the conductive layers. It may as a variant be a question of zones in which the active layer has a thickness smaller than a preset nominal thickness in a direction in which the stack is produced.

These zones of larger free volume may be caused by particles on the surface at the moment of deposition of the thin layer, by the presence of substrate defects, such as topological defects or peaks on the surface, or zones having different surface tensions, by the presence of particles in solution (non-dissolved material) when the active layer is deposited by liquid processing, or by local dewetting of the active layer from the deposition surface, etc. These holes may have a lateral dimension of 1 nanometer to several hundred microns. They are generated during the formation of the thin layer.

These defect zones are generated during the fabrication of the device. These zones of larger free volume may generate electrical leaks (zones in which the current will flow more easily between the two electrodes). Parasitic leakage currents may appear in electronic devices in which the thin film of interest is supposed to electrically isolate the conductors forming the conductive electrodes, in particular in the case of organic diodes. Thus, the presence of through-holes in the active layer may lead to the two conductive electrodes to be short-circuited locally.

These parasitic leakage currents are very disadvantageous when they occur in organic photodetectors or current-rectifying diodes. Specifically, in this case, the current in the reverse-bias regime of the diode and in the dark must be very low (of the order of one $nA/cm^2$). Thus, the slightest electrical leakage through defects in the layer of interest may cause this current to increase by several orders of magnitude and drastically and irreversibly degrade the performance of the diode.

These parasitic leakage currents are also disadvantages in organic solar cells, but to a lesser extent. In such a device, the lower the leakage current of the diode the better the solar cell will be able to respond to weak illumination.

Blind holes or zones of larger free volume are also prone to electrical breakdown. These zones are more fragile in the sense that they are liable to degrade more easily under electric field. Now, if in a photodiode the organic layer separating the two electrodes (photoconversion layer) contains at least one defect of sub-thickness type, the electric field increases in the region of sub-thickness and makes it more prone to electrical breakdown. If this electrical breakdown occurs, the electrical current read through the photoconversion layer increases, and the performance of the photodiode is thus degraded.

Thus, solutions for limiting parasitic leakage currents in the active layer of a stack and for limiting the risks of electrical breakdown have already been suggested. A first type of suggested solution aims to limit the number of defects in such active layers. It has in particular been suggested to increase the thickness of the active layer, to filter solutions before their deposition to form the active layer, to use substrates containing few defects, to clean the surface of the substrates before depositing the active layer or to limit the number of particles in the ambient air by working in a cleanroom.

However, the suggested solutions each have drawbacks. Specifically, too great an increase in active-layer thickness tends for example to degrade device performance. Hence, active layers are generally about 1 nm to a few hundred nanometers in thickness. Moreover, filtration requires a solution of good solubility, this not being the case for all the materials currently used for active layers. In addition, filtration steps are difficult to implement on an industrial scale. Substrates containing few defects are substrates having good properties with respect to planarity and are of high cost. With regard to substrate cleaning, it may nonetheless leave certain sizes of particle behind. It is expensive to work in cleanrooms.

It has also been suggested to use double active layers. However, the double-layer concept, which is in particular implemented by wet processing, requires complex techniques in which selective solvents are employed or layers cross-linked to be used in order not to prevent the first active layer from being dissolved during the deposition of the second active layer.

A second type of solution aiming to repair defects in the active layer has also been suggested. It has in particular been suggested, in the international patent application published under publication number WO 2013/182970, to locally etch a first conductive layer on which the active layer is formed through the holes in the organic layer and thus to prevent contact between the first conductive layer and the second conductive layer formed on the active layer. This technique has the drawback of not working with every type of first conductive layer. In particular, this technique does not work when the material of the first conductive layer is difficult to wet etch.

It has also been suggested, in United States patent application US 2012/0126277 to form a first conductive layer, to form an active layer on the first conductive layer then to form an insulating layer on the active layer so that the insulating layer penetrates into a free volume of through-hole type in the active layer. The portions of the insulating layer that are located outside the hole are then removed in order to make a free surface of the active layer appear while leaving the insulating layer inside the hole. A second layer able to conduct electricity is then formed on the active layer and the insulating layer. This process allows parasitic electrical leakage currents through the active layer of a stack of the conductor/active layer/conductor type to be limited, and prevents degradation of the performance of the device produced by means of the stack. In contrast, this method has several drawbacks. The choice of the material forming the insulating layer is limited. Specifically, the latter must be able to fill the hole, be formed on the active layer and be removed from the active layer in order to make the free surface appear without attacking the active layer.

SUMMARY OF THE INVENTION

One aim of the invention is to limit at least one of the aforementioned drawbacks.

To this end, one subject of the invention is a method for producing a stack, comprising the following steps:

forming a first layer able to conduct electricity, forming a layer of interest on the first layer, said layer of interest comprising at least one free volume, forming at least one repairing element, each repairing element at least partially filling a free volume, called the free volume of interest, the repairing element comprising at least one insulating layer and leaving free an upper surface of the layer of interest opposite the first layer and located outside of said at least one free volume, forming a second layer, able to conduct electricity, on the layer of interest, the second layer covering the repairing element and the free surface, the step of forming the repairing element comprising the following steps:

forming, on the layer of interest, a buffer layer that extends at least partially into the free volume of interest, covering at least one portion of the buffer layer located in the volume of interest with a filling layer, said buffer layer and the filling layer being made from different materials.

Advantageously, the filling layer penetrates into at least one free volume of interest.

Advantageously, the buffer layer prevents any physical contact between the layer of interest and the filling layer.

Advantageously, the method comprises a step of removing an excess of the buffer layer and an excess of the filling layer so as to make the free surface of the layer of interest appear and so as to leave a remainder of the buffer layer in the free volume of interest.

Advantageously, the filling layer penetrates into at least one free volume of interest and the removal step is carried out so as to leave a remainder of the filling layer in said free volume of interest, said remainder at least partially covering the remainder of the buffer layer.

Advantageously, the buffer layer is a layer made of insulating material.

As a variant, the step of forming the buffer layer comprises a step of depositing a layer made of conductive material and a first step of oxidizing the layer made of conductive material.

Advantageously, the step of removing the excess of the buffer layer and of the filling layer is followed by a second step of oxidizing a free surface of the remainder of the buffer layer.

According to one embodiment, the filling layer is insulating. As a variant, the filling layer is able to conduct electricity.

Advantageously, the sum of the thickness of the buffer layer and of the thickness of the filling layer outside of the free volume, in a stacking direction of the stack, is larger than or equal to the nominal thickness e of the layer of interest outside of the free volume.

Advantageously, the buffer layer is an insulating metal oxide.

Advantageously, the filling layer is a resist of SU-8 type or is made of parylene.

The buffer layer may be vacuum deposited, advantageously by atomic layer deposition.

The filling layer may be deposited by wet processing.

Advantageously, the removal step comprises the following steps:

removing the excess of the filling layer so as to make a free surface of the repairing layer appear, removing the excess of the buffer layer so as to make the free surface of the active layer appear.

Advantageously, the step of removing the excess of the buffer layer comprises a selective removal step allowing the buffer layer to be removed without attacking the layer of interest.

Advantageously, the step of removing the excess of the filling layer comprises a selective removal step allowing the filling layer to be removed without removing the buffer layer.

The invention also relates to a stack comprising, in succession:

a first layer able to conduct electricity, a layer of interest comprising at least one free volume, a repairing element at least partially filling a free volume, called the free volume of interest, comprising at least one layer made of insulating material and leaving free an upper surface of the layer of interest located outside of said at least one free volume, a second layer, able to conduct electricity covering the repairing element and the upper surface, the repairing element comprising a buffer layer and a filling layer at least partially covering a portion of the buffer layer located in the volume of interest, the buffer layer and the filling layer being made from different materials.

BRIEF DESCRIPTION OF THE DRAWINGS

Other features and advantages of the invention will become apparent on reading the following detailed description, which is given by way of nonlimiting example with reference to the appended drawings, in which.

DETAILED DESCRIPTION

FIGS. 1a to 1d illustrate the various steps of a process for producing a stack 100 of layers and the various products obtained at the end of these steps. The various layers of the stack 100 are stacked in a stacking direction z.

In the present application, by conductive what is meant is electrically conductive and by insulating what is meant is electrically insulating.

The first step 101 of the process according to the invention is a step of forming a first layer 2 on a substrate 1. The step 101 for example consists in depositing the first layer 2 on the substrate.

The first layer 2 is able to conduct electricity. It may be made of a semiconductor or conductive material. It may form an electrode, for example in the case of organic photodetectors and organic solar cells of the first electrode/active layer/second electrode type.

The substrate 1 may be of any nature. It may for example be a rigid substrate made of glass or a supple substrate, for example one made of a plastic, PET or PEN for example.

Figure 1A:
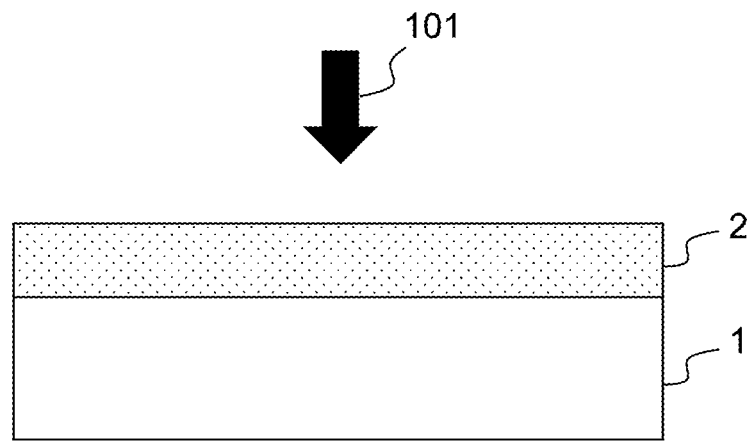
FIGS. 1a to 1d show the products obtained in successive steps of producing a stack according to the invention, the arrows representing the steps carried out to obtain these various products.
Figure 1B:
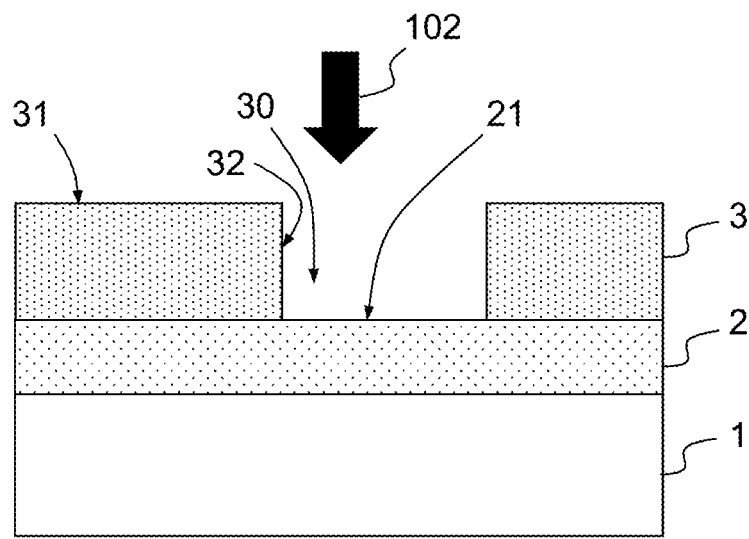

The second step 102 consists in forming an active layer 3, which is shown in FIG. 1b, on the first layer 2. The active layer 3 is advantageously deposited in the form of a thin layer. It has a thickness for example comprised between 1 nm and several microns.

The active layer 3 may comprise at least one material that is of organic nature such as for example a polymer, an oligomer, a dendrimer or a small organic molecule. It may comprise at least one material of inorganic nature, such as, for example, a silicon oxide, a silicon nitride, alumina, or a quantum dot. It may also comprise at least one material from the perovskite family.

In the case of organic photodetectors and organic solar cells, the active layer 3 may be a photoconversion layer.

The active layer 3 advantageously comprises a blend of an electron-donor material and of an electron-acceptor material. The donor semiconductor may be a molecule, an oligomer or a π-conjugated organic polymer, i.e. one with an alternation of single bonds and double bonds. The blend conventionally used is the pair regioregular poly(3-hexylthiophene) (RR-P3HT) and (6,6)-phenyl-C61 butyric acid methyl ester ([60]PCBM). Other donor polymers of wide band gap (PFB, TFB, PTAA, PCDTBT, etc.) or of narrow band gap (PDPP3T, PCPDTBT, Si-PCPDTBT, PDDTT, etc.) will possibly advantageously be used. Likewise, with respect to the acceptor material, other materials may advantageously be used, such as derivatives of C60, C70 or C80 (PCBM, indene-C60, indene-C60 bis adduct), carbon nanotubes, molecules of acene diimide, or polymers (F8BT, N2200). The acceptor material may also be of inorganic nature, such as nanoparticles of $TiO_2$ or of ZnO.

Thus, the active layer 3 may be a heterojunction of an electron-donor material and of an electron-acceptor material taking the form of a stack of a plurality of elementary active layers. The active layer may also take the form of a single layer comprising a bulk heterojunction. It then comprises a mixture of two materials forming a bulk heterojunction, i.e. an intimate blend of two materials on the nanoscale.

In the figures, the active layer 3 has been shown in the form of a single layer, i.e. a single elementary active layer. This active layer 3 makes contact with the first layer 2.

The constituent materials of the active layer 3 may be deposited in the form of solutions. These solutions may be filtered so as to limit the presence of aggregates. This also allows the creation of defects in the active layer to be limited.

Optionally, an interface layer may be deposited on the first layer 2 before the active layer 3. In other words, the interface layer is interposed between the first layer 2 and the layer of interest 3. This layer has not been shown in FIG. 1b. This interface layer may for example be formed from PEDOT:PSS, graphene, a polyfluorene derivative, tetrakis(dimethylamino)ethylene (TDAE), polyethylene oxide, ethoxylated polyethylenimine (PETE), branched polyethylenimine (PEI), $WO_3$, $MoO_3$, LiF, NiO, $V_2O_5$, $TiO_x$, ZnO or $CsCO_3$ or even using a self-assembled monolayer (SAM) on the surface of the conductive electrode.

This interface layer allows the work function of the first layer 2 and the active layer 3 to be adjusted. For example, if ITO has a work function of 4.6 eV, the use of a thin layer of ZnO on its surface allows its surface work function (at the electrode/active layer interface) to be adjusted to 4.3 eV without too greatly modifying the conductivity of the conductive electrode perpendicularly to the substrate.

As indicated above, the layer of interest 3 contains at least one zone containing a free volume 30. This free volume 30 consists of a through-hole in the nonlimiting example of FIG. 1b. The free volume is located plumb with the first layer 2.

Generally, the free volumes or defects may consist of micron-sized holes or of zones having a smaller thickness than a preset desired thickness e of the active layer in the stacking direction z. It may be a question of porosities or even volumes that are not occupied by the polymer chains. It has dimensions comprised between 1 nm and several millimeters.

The free volumes are defects in the layer of interest. These defects are pre-existing. In other words, these free volumes or defects are formed during the formation of the layer of interest.

Figure 1C:
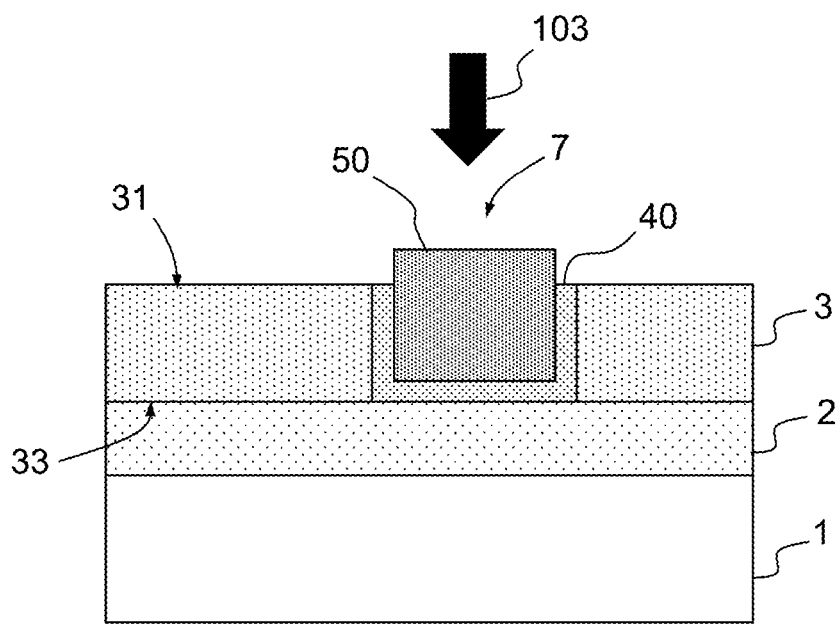

The process according to the invention comprises a repairing step 103 consisting in forming a repairing element 7, which is shown in FIG. 1c. The repairing element 7 at least partially, and preferably completely, fills at least one free volume 30, which is called the volume of interest.

The repairing element 7 leaves free an area of a surface 31 of the active layer 3, i.e. one portion of the upper surface of the active layer 3, i.e. the surface of the active layer 3 that is opposite the surface 33 of the active layer located facing the first layer 2. The surface 31 is located outside any free volume 30.

The repairing element 7 comprises at least one electrically insulating layer.

Figure 1D:
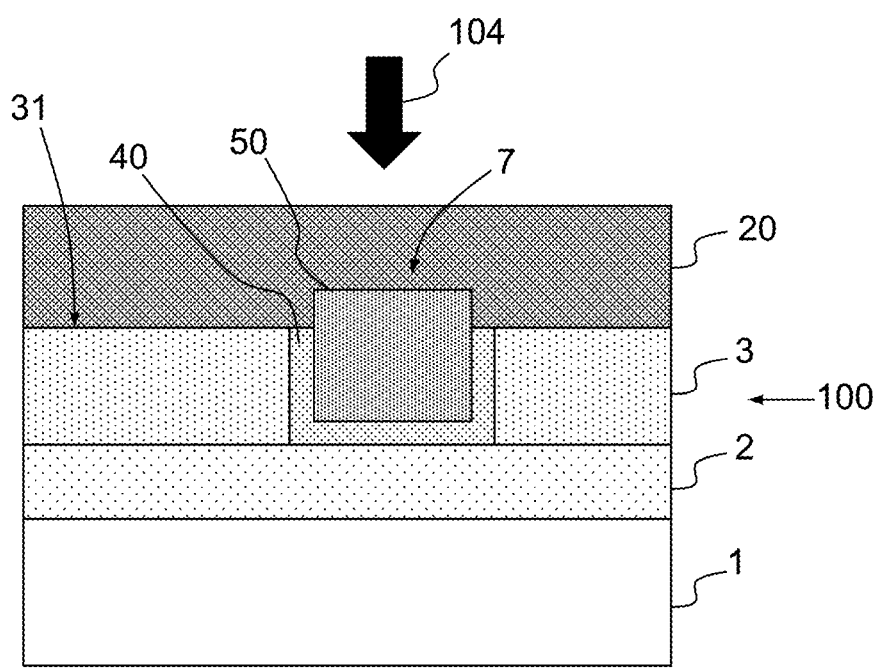

The process for producing the stack 100 furthermore comprises a step 104 of forming a second layer 20, shown in FIG. 1d, able to conduct electricity on the repairing element and the layer of interest 3. It may be a question of a layer made of semiconductor or electrically conductive material. It may form a conductive electrode, for example in the case of organic photodetectors and organic solar cells of first electrode/active layer/second electrode type.

Advantageously, the second layer 20 covers the repairing element 7 and the free surface 31. It is advantageously continuous. The second layer 20 makes contact with the repairing element 7 and with the free surface 31.

The repairing element 7 comprising at least one insulating layer, at least partially filling the interior of the free volume 30 and being interposed between the two layers 2 and 20, allows the risk of physical and electrical contact between the two layers 2 and 20 to be limited and thus short-circuits and leakage currents through the free volume 30 to be limited.

Advantageously, the repairing element 7 is configured and arranged to prevent any physical and electrical contact between the first layer 2 and the second layer 20 through the free volume of interest 30. It comprises at least one insulating layer ensuring this physical and electrical separation. The repairing element 7 allows the increase in leakage currents through the free volumes to be limited as much as possible and the risk of electrical breakdown when the free volumes are of blind-hole type to be limited.

Figure 2A:
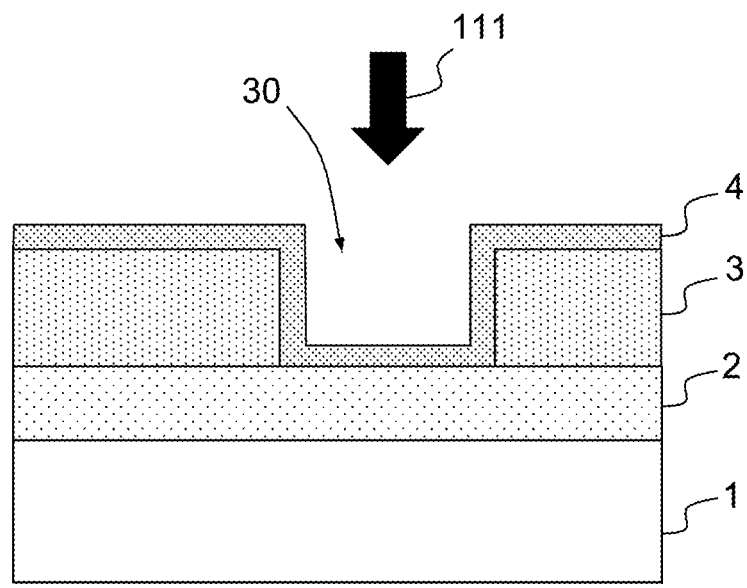
FIGS. 2a to 2d show the products obtained in successive steps allowing the repairing element to be formed.
Figure 2B:
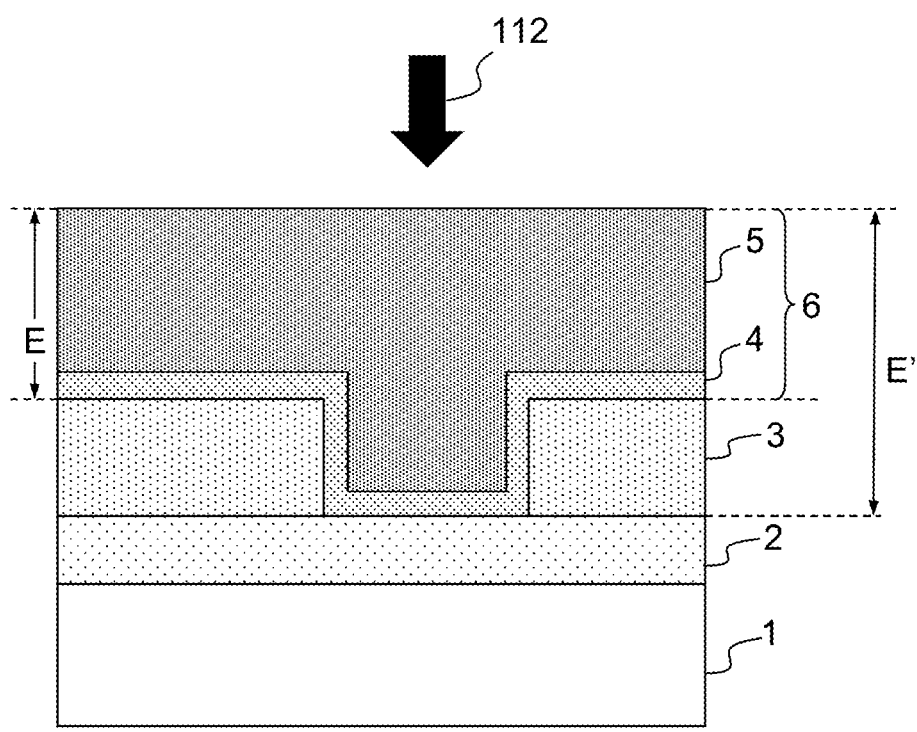
Figure 2C:
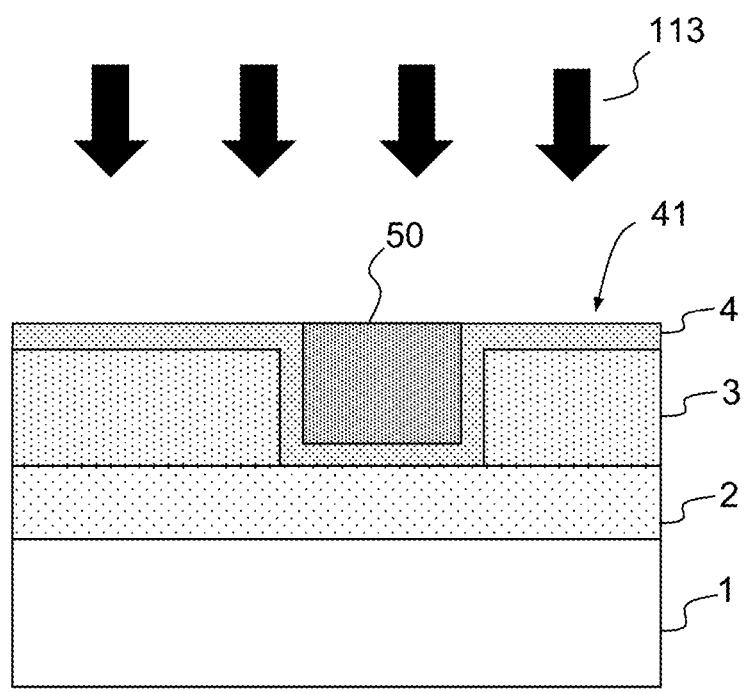
Figure 2D:
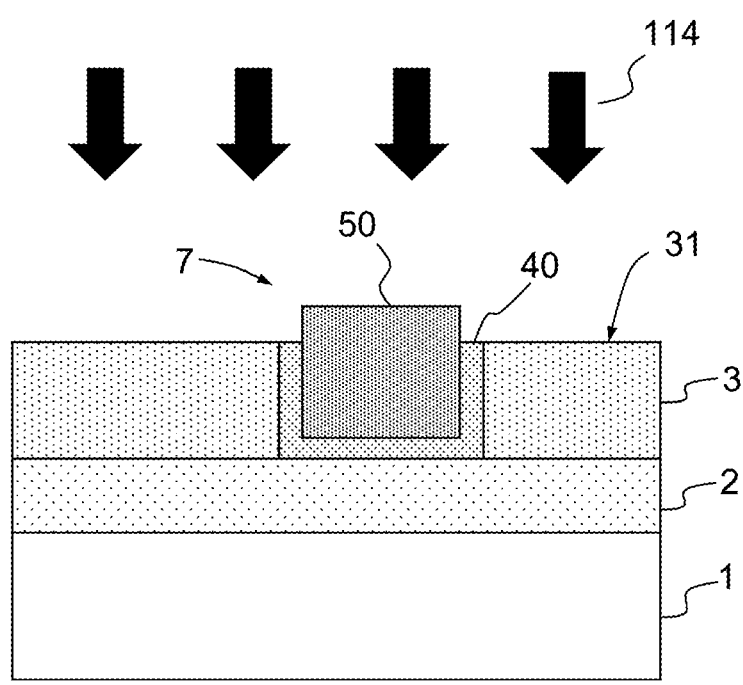

The repairing element 7 may have, along the z-axis, a thickness larger than or equal to the depth of the free volume along the z-axis as shown in FIG. 2d or indeed be flush with the free surface 31 or indeed have a thickness smaller than the depth of the free volume along the z-axis. It may also have a thickness that is constant along the z-axis, or that is not constant as is shown in FIG. 2d.

The process of forming the repairing element then its structure will now be described in more detail.

According to the invention, the step 104 of forming the repairing element 7 comprises the following steps, which are shown in FIGS. 2a and 2b:

forming 111 a buffer layer 4 on the active layer 3 so that the buffer layer 4 extends at least partially into the free volume of interest 30, forming 112 what is called a filling layer 5 covering at least one portion of the buffer layer 4 located in the volume of interest 30. In the embodiment of the figure, the filling layer completely covers the buffer layer 4, Moreover, the buffer layer 4 and the filling layer 5 are made from different materials.

The use of different materials increases the choice of materials usable to form the layers 4 and 5 and increases the choice of their respective forming processes.

The process according to the invention makes it possible to at least partially preserve the integrity of the active layer 3 and/or of the first layer 2 and to ensure the free volume 30 is well filled. It is in particular possible to choose a filling layer 5 that ensures the free volume is well filled but a deposition process and/or a removal process of which, as will be described in more detail below, could deteriorate the active layer 3, since the latter is protected by the buffer layer 4 in the steps of deposition and/or processing of the filling layer 5. It is thus possible to choose a layer 4 that is able to be deposited and/or removed without deteriorating the active layer 3 but that in return does not necessarily have good properties with respect to filling free volumes.

Advantageously, the buffer layer 4 is interposed between the filling 5 and the active layer 3.

Advantageously, steps 111 and 112 are produced so that the buffer layer 4 prevents any physical contact between the filling layer 5 and the active layer 3. Protection of the entirety of the active layer 3 is then ensured. Thus, the buffer layer 4 advantageously covers the entirety of the surface 32 bounding the free volume 30. This makes it possible to ensure maximum filling of the volume 30 by means of the repairing layer 5 while ensuring maximum protection of the active layer 3.

The filling layer 5, formed or deposited on the buffer layer 4, in fact penetrates into free volumes 30 of sufficient size, i.e. free volumes 30 that are not completely filled by means of the buffer layer 4. Volumes of smaller size are completely filled by the buffer layer 4 for a given thickness of buffer layer deposited on the active layer 3. It allows these large free volumes to be well filled even if the buffer layer 4 cannot be deposited in the form of a layer that is sufficiently thick to fill their volume. Advantageously, the filling layer 5 is formed so that it at least partially fills one free volume of interest among the free volumes of interest.

In the process shown in FIGS. 2a to 2b, the layers 4 and 5 extend into the free volume 30 and over the surface 31. More generally, the layers 4 and 5 may extend over an upper free surface of the active layer 3 located outside any free volume 30.

The step of forming the repairing element 7 advantageously comprises a removal step 113, 114, which is shown in FIGS. 2c and 2d. In this step, an excess of each of the layers 4, 5 is removed so as to make the free surface 31, which is shown in FIG. 2d, of the active layer 3 appear and so as to preserve a remainder 40 of the buffer layer 4, said remainder 40 at least partially penetrating into the free volume 30. This process is easy and rapid. It does not require a precision sufficient to deposit the layers 4 and 5 solely in and plumb with the free volume 30.

In the process shown in FIGS. 2c and 2d, the removal step is carried out so as to preserve a remainder of the repairing layer 5, this remainder 50 penetrates at least partially into the volume 30 and at least partially covers the remainder of the buffer layer 4.

The layers 4 and 5 are advantageously formed in the form of continuous layers. The layer 4 partially extends into the free volume 30 and facing the surface 31. The layer 5 extends partially facing the free volume 30 and facing the surface 31. As a variant, at least one of these layers is formed in the form of a discontinuous layer.

As a variant, the layers 4 and 5 are deposited locally solely in at least one of the volumes 30. In this case, the process does not comprise any removal step or the removal step does not comprise removal from around the volumes 30. The layers 4 and 5 are then the layers 40 and 50 forming the repairing element 7, respectively. This embodiment is slower and more expensive than the preferred embodiment described above.

In the nonlimiting embodiment of FIG. 2d, the repairing element 7 is formed by the remainders 40, 50 of the layers 4 and 5 at the end of the removal step 113, 114. The remainder of the layer 4 and the remainder of the layer 5 form a remaining buffer layer 40 and a remaining filling layer 50, respectively.

In the embodiment of the figures, the buffer layer 4 is contiguous with the active layer 3.

In the embodiment of the figures, the filling layer 5 is contiguous with the buffer layer 4.

Advantageously, the layer 4 is made of an electrically insulating material. It thus allows all or some of the electrical insulation function of the element 7 to be performed. Advantageously, the remaining buffer layer 40 prevents any physical contact between the layers 2 and 20 that are able to conduct electricity, and between the layer 2 and the remaining repairing layer 50. The repairing element 7 thus allows any physical contact between the layers 2 and 20 to be prevented without it being necessary to use an electrically insulating repairing layer 5 or 50. The choice of materials that may be used to produce this layer 5 or 50 is thus larger. To this end, the remaining buffer layer 40 advantageously, but not necessarily, covers the portion 21 of the surface of the first layer 2 onto which the free volume 30 opens, when the free volume is of through-hole type.

As a variant, the buffer layer 4 comprises a layer of a conductive material capable of being oxidized so as to form an electrically insulating oxide and a layer of said oxide covering the layer of conductive material. The step of forming the buffer layer 4 then comprises a step of depositing or forming a layer of conductive material and a first step of oxidizing the surface of this layer so as to form an insulating layer. This treatment may quite simply consist of exposure to air for a few minutes or of an oxidizing treatment in a high-pressure oxygen plasma (100 mT minimum and a power between 200 and 500 W).

When the excess of the layers 4 and 5 is removed with a view to forming the layers 40 and 50, the oxide layer is then removed beyond the interface between the layers 4 and 5. The removal step 113, 114 is then advantageously followed by a second oxidizing step for oxidizing the surface of the remaining portion of the buffer layer 4 so as to make it insulating so as to obtain the final buffer layer 40. This allows an insulating layer 40 to be obtained and leakage currents to limited as much as possible. As a variant, the process does not comprise this oxidizing step.

Advantageously, the filling layer 5 is made of an electrically insulating material. When the two layers 4 and 5 (or 40 and 50) are insulating, the embodiment is optimal because it allows the amount of insulating material between the two conductive layers 2, 20, i.e. between the layers between which the layer of interest is sandwiched, to be maximized. The distance between the two conductive layers 2, 20 is maximum over all the lateral surface (i.e. the surface in a plane perpendicular to the direction of the stack) of the repairing element 7, this allowing the value of the electric field in the interior of the defect to be limited as much as possible, the value of this electric field being inversely proportional to the distance between the electrodes.

In a less advantageous variant, the filling layer 5 or the final filling layer 50 is a layer made of a semiconductor or conductive material able to conduct electricity. In other words, the filling layer 5 is able to conduct electricity.

The insulating material from which the buffer layer 4 or 40 is formed is for example chosen from among the following insulating materials: an insulating metal oxide such as for example alumina ($Al_2O_3$), parylene, polyimide, PMMA, polystyrene, polyvinylpyrrolidone, polyvinylphenol, polyvinyl alcohol, polyallylamine, the fluoropolymer CYTOP, and the fluorinated photoresist OSCoR 4001 sold by Orthogonal®. The use of an insulating metal oxide, such as for example alumina, is advantageous because metal oxides are good electrical insulators and may be deposited in thin layers (typically <100 nm). The advantage of this is that it is possible to deposit the buffer layer with vacuum techniques, in particular atomic layer deposition (ALD), which allows layers that are very conformal or that achieve a very good coverage to be deposited.

The conductive material from which these layers 4, 40 are formed is for example a metal, for example aluminum, Cr, or Ti.

Advantageously, the buffer layer 4 or the layer 40 is formed by atomic layer deposition or comprises a step of vacuum deposition of a layer. Atomic layer deposition or ALD is called depOt par couche atomique in French. This deposition process allows deposits that conform to the surface bounding the free volume to be produced, this allowing all the surface bounding the free volume to be covered. Moreover, if this deposition is carried out at a sufficiently low temperature (lower than or equal to about 150° C.), this technique does not damage organic active layers. However, this deposition technique is expensive. Furthermore, it does not allow deposits of large thickness to be produced. Specifically, the deposits produced typically have a thickness comprised between 0.1 nm and 300 nm. It is possible to form deposits having a thickness larger than 300 nm but the deposition times then become extremely long (of about several hours). The deposits thus produced conform to the surface bounding the free volume but are weakly planarizing. The deposition of the filling layer 5 therefore allows free volumes the size of which is too large for it to be possible to completely fill them by ALD to be filled.

Generally, the layer 4 or the layer 40 is advantageously formed by vacuum deposition or comprises a step of vacuum deposition of a layer. This deposition is for example carried out using one of the following techniques: chemical vapor deposition (CVD), plasma-enhanced chemical vapor deposition (PECVD), ALD, thermal evaporation, electron-beam evaporation, plasma polymerization. Vacuum deposition techniques often yield conformal deposits that cover well, and that may allow the entirety of the surface 32 bounding a free volume to be covered. In addition, as the active layer 3 is soluble in solvents, vacuum techniques avoid the use of a solvent liable to deteriorate the active layer.

The filling layer 5 or the insulating layer 50 is made from a material for example selected from the following list of insulating materials: parylene, a photoresist such as the epoxy resins SU-8 and SU-18, another epoxy resin or polyepoxide, polystyrene, polyimide, polymethyl methacrylate (PMMA), polyvinylpyrrolidone, polyvinylphenol, polyvinyl alcohol, polyallylamine, the fluoropolymer CYTOP, the fluorinated photoresist OSCoR 4001 sold by Orthogonal®, and PEDOT. As a variant, the filling layer 5 or the layer 50 is a layer of electrically conductive material such as for example PEDOT:PSS or polyaniline (PANI). The use of parylene, for example parylene C, is advantageous because it possesses good surface coverage properties. It will fill defects and deposit on the surface of the active layer while planarizing its surface. However, this type of layer must be removed by plasma etching. This technique is liable to etch the active layer. The buffer layer 4 (FIG. 2a) allows the layer of interest 3 to be protected from this type of etching.

The use of SU-8 resist is also advantageous because the resist SU-8 is a viscous polymer able to be deposited in quite thick layers.

The filling layer 5 or the layer 50 may be a layer of the same material as the layer of interest 3. It is for example made of an organic material.

It may be deposited by wet processing using a technique such as spin coating, dip coating, slot-die coating, laser printing, heliography, flexography, inkjet coating, spray coating, etc. These deposition techniques allow thick deposits to be produced and have a greater planarizing effect than vacuum deposition.

Advantageously, parylene is deposited under vacuum or partial vacuum, for example using a thermal evaporation technique.

Of course, the layers 4 and 40 may be deposited by wet processing and the layers 5 and 50 may be deposited by vacuum deposition.

Advantageously, the thickness E of the repairing layer 6 formed by the buffer layer 4 and the filling layer 5, outside of the defect zone 30 and in the stacking direction z, is larger than or equal to the nominal thickness e of the layer of interest 3 and preferably larger than or equal to one and a half times the nominal thickness of the layer of interest 3 and preferably equal to twice the nominal thickness of the layer of interest 3. The nominal thickness e of the layer of interest 3 is the thickness of the layer of interest outside of free volumes 30 and along the z-axis. This promotes the planarization of the layer of the repairing layer and allows the removal of the excess of the repairing layer, in particular by etching, to be facilitated while leaving a portion of the repairing layer in the interior of the defect. Specifically, the thickness E' of the repairing layer in the defect zone is larger than the thickness E of the repairing layer around the defect zone 30.

More generally, the thickness of the repairing layer is advantageously finely adjusted depending on the lateral dimension (i.e. in a plane perpendicular to z) and on the depth (in the z-direction) of the defects to be passivated.

We will now describe the step 113, 114 of removing the excess of the repairing layer 6 so as to make a free surface 31 of the layer of interest 3 appear outside of the free volume 3 and so as to leave at least one portion of the repairing layer 6 in the free volume 30.

Advantageously, as shown in FIGS. 2c and 2d, the removal step 113, 114 comprises the following steps:
- removing 113 an excess of the filling layer 5 so as to make a free surface 41 of the buffer layer 4 appear beyond the free volume 30 and, advantageously, so as to leave the rest of the filling layer 5,
- removing 114 an excess of the buffer layer 4 so as to make the free surface 31 of the layer of interest 3 appear and to leave the rest of the buffer layer 4.

The step of forming the layer 40 then comprises the steps 111 and 113 and the step of forming the layer 50 comprises the steps 112 and 114.

Advantageously, as shown in the figures, the free surface 31 is a portion of the surface of the layer of interest that makes contact with the repairing layer 6. As a variant, the step of removing the excess of the repairing layer 6, or of the buffer layer, removes some of the layer of interest 3 so as to make the free surface 31 appear.

Advantageously, the free surface 41 is a portion of the surface of the buffer layer that makes contact with the filling layer 5. As a variant, the step of removing the excess of the filling layer 5 removes some of the buffer layer 4 so as to make the free surface 41 appear.

The two removal steps 113 and 114 are advantageously carried out by means of different removing techniques. As a variant, this step may be carried out by means of the same removing technique.

Advantageously, the step 113 of removing the excess of the filling layer 5 is a selective removal step allowing the excess of the filling layer 5 to be removed without removing the buffer layer 4. This technique avoids having to controllably stop the step of removing the excess of the filling layer 5 just on the portion of the surface of the buffer layer 4 that makes contact with the filling layer 5 outside of the free volumes 30. Moreover, it allows the layer of interest 3 to be protected from the process used to remove the filling layer 5 by means of the buffer layer 4.

Advantageously, the step 114 of removing the excess of the buffer layer 4 is a selective removal step allowing the buffer layer 4 to be etched without removing the layer of interest 3. As a variant, the step 114 of removing the excess of the buffer layer 4 is a selective removal step allowing the excess of the buffer layer 4 to be removed without affecting the electrical and/or optical and/or mechanical properties of the layer of interest 3, i.e. without attacking the layer of interest 3. These techniques make it possible to avoid having to controllably stop the step of removing the buffer layer 4 just on the free surface 31 of the active layer 3.

The removal steps are for example achieved using an etching technique, preferably a wet etching technique, i.e. via contact with an etching solution. In certain cases, this removal is achieved with a solvent. However, it is the expression "etching solution" that will be generally used in the rest of the description.

The etching solution used to remove the excess of the buffer layer 4 must be chosen so as to not degrade the electrical, optical and mechanical properties of the layer of interest 3. The electrical properties of the layer of interest 3 may be degraded because of an increase or a decrease in its conductivity, or even because of the generation of intrinsic or extrinsic electrical traps in the active layer. The degradation of the optical properties of the layer of interest 3 may for example result in a decrease in the light absorption properties at the desired wavelength. Lastly, the degradation of the mechanical properties may in particular cause debonding, cracking or the active layer to lose flexibility. Thus, generally, the etching solution used will be selective, i.e. it will be able to etch the buffer layer 4, without however etching or attacking the layer of interest 3.

Likewise, advantageously, when the excess of the filling layer 5 is removed by wet etching, advantageously, the etching solution used will be selective, i.e. it will be able to etch the filling layer 5, without however etching or attacking the buffer layer 4.

Generally, the etching solution will comprise an acid, a base or a neutral solution. It will possibly be pure or even diluted in water or in a solvent that is orthogonal to the active layer, i.e. a solvent that is not liable to attack or dissolve the active layer. The solvent that is orthogonal to the organic active layer may, for example, nonlimitingly, be methanol, ethylene glycol, or n-butylacetate. The choice made depends on the nature of the active layer.

The etching solution may be applied to all the surface of the active layer or locally.

As a variant, at least one of the removal steps 113, 114 is carried out by dry etching, such as for example by ion or plasma etching (RIE: deep ion etching, RIE-ICP (plasma torch or reactive ion etching, etc.)), or a combination or alternation of the 2. Dry etching allows the uniformity of the etch over all the surface to be better controlled. It is also possibly to finely control the etch rate and thus better control the end of the etch. As a variant, the removal is for example achieved by exposure, laser ablation, grinding or lapping.

In certain cases, the surface of the layer of interest 3 will possibly be activated by a gentle physical or chemical treatment (for example a plasma treatment) the aim of which is to facilitate the penetration of the repairing layer into the defects of the active layer.

The present invention also applies to the field of organic transistors, such as for example thin-film transistors, i.e. what are more commonly known as organic thin-film transistors (OTFTs). In this type of conductor, the first layer 2 is a layer made of semiconductor deposited on source and drain electrodes and the second layer 20 is a gate electrode. The active layer or layer of interest is a layer of gate dielectric, which is interposed between the gate electrode and the semiconductor layer forming the first layer 2.

In one variant embodiment, the active layer 3 comprises a plurality of elementary active layers. The step of forming at least one repairing layer 7 may then be applied to one of the elementary active layers. The process may comprise one or more steps of forming at least one filling repairing element in one or more respective elementary active layers. Each layer 2 or 20 may then for example be a layer intended to form an electrode or indeed another elementary active layer.

The invention relates to the stack obtained with the process according to the invention.

The invention also relates to a stack comprising, in succession:
- a first layer 2 able to conduct electricity, a layer of interest 3 comprising free volumes 30, at least one of the free volumes, called the free volume of interest, being at least partially filled by means of a repairing element 7, a second layer 20 able to conduct electricity covering the repairing element and a zone of the layer of interest outside any free volume 30.

The repairing element 7 comprises at least one remaining buffer layer 40 extending at least partially into the free volume 30 and a remaining filling layer 50 covering at least one portion of the buffer layer 4 located in the free volume of interest 30. The remaining filling layer 50 at least partially covers the remaining buffer layer 40. These layers are made from different materials.

These layers are advantageously continuous.

The remaining buffer layer 40 is advantageously interposed between the layer of interest 3 and/or the first layer 2 and the remaining filling layer 50. Advantageously, the remaining buffer layer 40 completely covers the surface bounding the free volume 30.

The invention claimed is:

1. A method for producing a stack, comprising the following steps:
    forming a first layer able to conduct electricity,
    forming a layer of interest on the first layer, said layer of interest comprising at least one free volume,
    forming at least one repairing element, each repairing element at least partially filling a free volume, called the free volume of interest, the repairing element comprising at least one insulating layer and leaving free an upper surface of the layer of interest opposite the first layer and located outside of said at least one free volume,
    forming a second layer, able to conduct electricity, on the layer of interest, the second layer covering the repairing element and the free surface,
    the step of forming the repairing element comprising the following steps:
        forming, on the layer of interest, a buffer layer that extends at least partially into the free volume of interest,
        covering at least one portion of the buffer layer located in the volume of interest with a filling layer, said buffer layer and the filling layer being made from different materials.

2. The method for producing a stack as claimed in claim 1, wherein the filling layer penetrates into at least one free volume of interest.

3. The method for producing a stack as claimed in claim 1 wherein the buffer layer prevents any physical contact between the layer of interest and the filling layer.

4. The method for producing a stack as claimed in claim 3, furthermore comprising a step of removing an excess of the buffer layer and an excess of the filling layer so as to make the free surface of the layer of interest appear and so as to leave a remainder of the buffer layer in the free volume of interest.

5. The process for producing a stack as claimed in claim 4, wherein the filling layer penetrates into at least one free volume of interest and the removal step is carried out so as to leave a remainder of the filling layer in said free volume of interest, said remainder at least partially covering the remainder of the buffer layer.

6. The process for producing a stack as claimed in claim 1, wherein the buffer layer is a layer made of insulating material.

7. The process for producing a stack as claimed in claim 1, wherein the step of forming the buffer layer comprises a step of depositing a layer made of conductive material and a first step of oxidizing the layer made of conductive material.

8. The process for producing a stack as claimed in claim 7, wherein the step of removing the excess of the buffer layer and of the filling layer is followed by a second step of oxidizing a free surface of the remainder of the buffer layer.

9. The process for producing a stack as claimed in claim 1, wherein the filling layer is insulating.

10. The process for producing a stack as claimed in claim 1, wherein the filling layer is able to conduct electricity.

11. The process for producing a stack as claimed in claim 1, wherein the sum of the thickness of the buffer layer and of the thickness of the filling layer outside of the free volume, in a stacking direction (z) of the stack, is larger than or equal to the nominal thickness e of the layer of interest outside of the free volume.

12. The process for producing a stack as claimed in claim 1, wherein the buffer layer is an insulating metal oxide.

13. The process for producing a stack as claimed in claim 1, wherein the filling layer is a resist of SU-8 type or is made of parylene.

14. The process for producing a stack as claimed in claim 1, wherein the buffer layer is vacuum deposited.

15. The process for producing a stack as claimed in claim 14, wherein the buffer layer is deposited by atomic layer deposition.

16. The process for producing a stack as claimed in claim 1, wherein the filling layer is deposited by wet processing.

17. The process for producing a stack as claimed in claim 2, wherein the removal step comprises the following steps:
    removing the excess of the filling layer so as to make a free surface of the repairing layer appear,
    removing the excess of the buffer layer so as to make the free surface of the active layer appear.

18. The process for producing a stack as claimed in claim 17, wherein the step of removing the excess of the buffer layer comprises a selective removal step allowing the buffer layer to be removed without attacking the layer of interest.

19. The process for producing a stack as claimed in claim 17, wherein the step of removing the excess of the filling layer comprises a selective removal step allowing the filling layer to be removed without removing the buffer layer.

20. The process for producing a stack as claimed in claim 1, wherein the free volumes are defects.

21. A stack comprising, in succession:
    a first layer able to conduct electricity,
    a layer of interest comprising at least one free volume,
    a repairing element at least partially filling a free volume, called the free volume of interest, comprising at least one layer made of insulating material and leaving free an upper surface of the layer of interest located outside of said at least one free volume,
    a second layer, able to conduct electricity covering the repairing element and the upper surface,
    the repairing element comprising a buffer layer and a filling layer at least partially covering a portion of the buffer layer located in the volume of interest, the buffer layer and the filling layer being made from different materials.

* * * * *